United States Patent
Xu et al.

(10) Patent No.: US 12,265,289 B2
(45) Date of Patent: Apr. 1, 2025

(54) DISPLAY MODULE AND DISPLAY DEVICE FOR AVOIDING INCONSISTENT BRIGHTNESS AND VIEWING ANGLE AT A SPLICING POSITION OF SPLICED DISPLAY MODULES

(71) Applicant: TCL China Star Optoelectronics Technology Co., Ltd., Shenzhen (CN)

(72) Inventors: Hongyuan Xu, Shenzhen (CN); Xing Lei, Shenzhen (CN); Meinan Li, Shenzhen (CN)

(73) Assignee: TCL CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 17/620,110

(22) PCT Filed: Dec. 8, 2021

(86) PCT No.: PCT/CN2021/136595
§ 371 (c)(1),
(2) Date: Dec. 16, 2021

(87) PCT Pub. No.: WO2023/092662
PCT Pub. Date: Jun. 1, 2023

(65) Prior Publication Data
US 2024/0126109 A1  Apr. 18, 2024

(30) Foreign Application Priority Data
Nov. 24, 2021 (CN) .......................... 202111400030.8

(51) Int. Cl.
G02F 1/1333 (2006.01)
G02F 1/13 (2006.01)
(Continued)

(52) U.S. Cl.
CPC ........ *G02F 1/1323* (2013.01); *G02F 1/13336* (2013.01); *G02F 1/133388* (2021.01);
(Continued)

(58) Field of Classification Search
CPC ............... G02F 1/1323; G02F 1/13336; G02F 1/133388; G02F 1/133512; G02F 1/133603; G02F 1/133606
See application file for complete search history.

(56) References Cited

U.S. PATENT DOCUMENTS 9,261,723 B1  2/2016  Budni
2005/0185114 A1  8/2005  Cok
(Continued)

FOREIGN PATENT DOCUMENTS

CN  102339565 A  2/2012
CN  102346326 A  2/2012
(Continued)

OTHER PUBLICATIONS

International Search Report in International application No. PCT/CN2021/136595, mailed on May 5, 2022.
(Continued)

*Primary Examiner* — Paisley L Wilson
(74) *Attorney, Agent, or Firm* — PV IP PC; Wei Te Chung (57) ABSTRACT

A display module and a display device are provided. The display module includes a display panel and a compensation display assembly disposed in a frame region of the display panel. The compensation display assembly includes a viewing angle brightness adjustment layer. The viewing angle brightness adjustment layer includes an anti-peep function layer configured to adjust a brightness of the light emitted from the display function layer within a side viewing angle range of the display module after exiting from a side of the (Continued)

viewing angle brightness adjustment layer away from the display function layer.

16 Claims, 2 Drawing Sheets

(51) Int. Cl.
  *G02F 1/1335* (2006.01)
  *G02F 1/13357* (2006.01)
(52) U.S. Cl.
  CPC .. *G02F 1/133512* (2013.01); *G02F 1/133603* (2013.01); *G02F 1/133606* (2013.01); *G02F 1/133611* (2013.01)

(56) References Cited

U.S. PATENT DOCUMENTS

| | | | |
|---|---|---|---|
| 2013/0176352 | A1 | 7/2013 | Watanabe |
| 2020/0381586 | A1* | 12/2020 | Yu .......................... H01L 33/20 |
| 2021/0200019 | A1 | 7/2021 | Liang et al. |

FOREIGN PATENT DOCUMENTS

| | | |
|---|---|---|
| CN | 104157216 A | 11/2014 |
| CN | 104900167 A | 9/2015 |
| CN | 105761635 A | 7/2016 |
| CN | 205670225 U | 11/2016 |
| CN | 109116631 A | 1/2019 |
| CN | 110289295 A | 9/2019 |
| CN | 111312085 A | 6/2020 |
| CN | 111429851 A | 7/2020 |
| CN | 113013221 A | 6/2021 |
| CN | 113325632 A | 8/2021 |
| CN | 113540186 A | 10/2021 |
| JP | 2007086142 A | 4/2007 |
| JP | 2009237088 A | 10/2009 |
| JP | 2012060332 A | 3/2012 |
| JP | 2014212422 A | 11/2014 |
| JP | 2019514041 A | 5/2019 |
| KR | 20080101165 A | 11/2008 |
| TW | M560025 U | 5/2018 |

OTHER PUBLICATIONS

Written Opinion of the International Search Authority in International application No. PCT/CN2021/136595, mailed on May 5, 2022.

Chinese Office Action issued in corresponding Chinese Patent Application No. 202111400030.8 dated Jul. 25, 2022, pp. 1-7.

Japanese Office Action issued in corresponding Japanese Patent Application No. 特願2021-576395 dated Jan. 29, 2024, pp. 1-5.

* cited by examiner

DISPLAY MODULE AND DISPLAY DEVICE FOR AVOIDING INCONSISTENT BRIGHTNESS AND VIEWING ANGLE AT A SPLICING POSITION OF SPLICED DISPLAY MODULES

CROSS-REFERENCE TO RELATED APPLICATION

This application is a national phase application under 35 U.S.C. § 371 of PCT Application No. PCT/CN2021/136595 filed Dec. 8, 2021, which claims priority to Chinese Application No. 202111400030.8 filed Nov. 24, 2021, the contents of which are incorporated herein by reference in their entirety.

FIELD OF INVENTION

The present application relates to display technologies, and more particularly, to a display module and a display device.

BACKGROUND OF INVENTION

With the development of display technology, seamless splicing display technology has attracted widespread attention. At present, a structure of compensating display devices in the splicing region (non-display region) of the splicing screen is mainly adopted, and the effect of seamless splicing display is achieved through a linkage display of the splicing screen body and the compensation display assembly. For example, a Mini light-emitting diode (Mini-LED) light bar is configured to set the splicing position between multiple liquid crystal display (LCD). However, the splicing screen body and the compensation display assembly have different luminous brightness and viewing angle brightness attenuation degrees in the seamless splicing structure. For example, the Mini-LED is brighter under a side viewing angle, and the LCD is darker in the side viewing angle. Therefore, the seamless splicing structure easily causes the brightness and viewing angle of the splicing screen to be inconsistent in the splicing region.

SUMMARY OF INVENTION

The embodiments of the present application provide a display module and a display device to solve a technical problem of inconsistent brightness and viewing angles at a splicing region of a splicing screen.

Embodiments of the application provides a display module, including a display panel and a compensation display assembly, wherein the display panel includes a display region and a frame region adjacent to the display region, and wherein the compensation display assembly is disposed on the display panel and is positioned in the frame region, and wherein the compensation display assembly includes:

a display function layer disposed on the display panel and positioned in the frame region; and a viewing angle brightness adjustment layer including an anti-peep function layer disposed on the display function layer, wherein the anti-peep function layer is configured to adjust a brightness of the light emitted from the display function layer within a side viewing angle range of the display module after exiting from a side of the viewing angle brightness adjustment layer away from the display function layer, to make a ratio of a viewing angle brightness of the compensation display assembly to a viewing angle brightness of the display panel at any one of the side viewing angles within a preset threshold range;

wherein an angle value of the any one of the side viewing angles within the side viewing angle range is greater than a preset angle value.

In this embodiment, the compensation display assembly is disposed in the frame region of the display panel. The compensation display assembly includes the display function layer and the viewing angle brightness adjustment layer provided on the display function layer. Therefore, it is convenient to adjust the brightness of the light emitted by the display function layer under different side viewing angles after exiting from the side of the viewing angle brightness adjustment layer away from the display function layer. Thereby achieving the ratio of the viewing angle brightness of the compensation display assembly to the viewing angle brightness of the display panel under any one of the side viewing angles is within the preset threshold range, to avoid a problem of inconsistent brightness and viewing angle at the splicing position after the display modules are spliced.

Optionally, in the display module provided by the present application, the viewing angle brightness adjustment layer further includes a light-transmitting functional layer laminated with the anti-peep function layer, and wherein the anti-peep function layer has same transmittance at different front viewing angles within a front viewing angle range of the display module, and wherein the light-transmitting functional layer is configured to adjust a brightness of the light emitted from the display function layer within the front viewing angle range of the display module after exiting from a side of the viewing angle brightness adjustment layer away from the display function layer, to make a ratio of a viewing angle brightness of the compensation display assembly to a viewing angle brightness of the display panel in the front viewing angle range within the preset threshold range;

wherein an angle value of the any one of the front viewing angles is less than or equal to the preset angle value.

In this embodiment, the viewing angle brightness adjustment layer further includes the light-transmitting functional layer laminated with the anti-peep function layer. The light-transmitting functional layer can further reduce the viewing angle brightness of the compensation display assembly within the front viewing angle range, so that the ratio of the viewing angle brightness of the compensation display assembly to the viewing angle brightness of the display panel in the front viewing angle range is within the preset threshold range.

Optionally, in the display module provided by the present application, the light-transmitting functional layer includes an encapsulation layer laminated with the anti-peep function layer, and wherein the display functional layer includes a plurality of light-emitting devices arranged at intervals, and wherein the encapsulation layer is disposed on each of the light-emitting devices.

In this embodiment, the encapsulation layer is configured to encapsulate the light-emitting device, and a transmittance of the encapsulation layer can be adjusted by adjusting a material or structure of the encapsulation layer. In the front viewing angle range, the ratio of the viewing angle brightness of the compensation display assembly to the viewing angle brightness of the display panel is within the preset threshold range.

Optionally, in any two different side viewing angles within the side viewing angle range of the display module, a transmittance of the anti-peep function layer under a larger side viewing angle is less than a transmittance of the anti-peep function layer under a smaller side viewing angle.

In this embodiment, in any two different side viewing angles within the side viewing angle range of the display module, a transmittance of the anti-peep function layer under a larger side viewing angle is less than a transmittance of the anti-peep function layer under a smaller side viewing angle. That is, the transmittance of the anti-peep function layer decreases as the angle value of the side viewing angle increases, thereby increasing an attenuation rate of the viewing angle brightness of the compensation display assembly within the side viewing angle range. So that the ratio of the viewing angle brightness of the compensation display assembly to the viewing angle brightness of the display panel in any one of the side viewing angles is within the preset threshold range.

Optionally, in the display module provided in the present application, the anti-peep function layer includes black retaining walls disposed between each of the light-emitting devices, and a height of the black retaining wall is greater than a height of the light-emitting device in a direction perpendicular to the display module, and wherein the encapsulation layer is disposed on the black retaining wall and each of the light-emitting devices;
in any two different side viewing angles, a light-emitting area of the light-emitting device blocked by the black retaining wall under a larger side viewing angle is larger than a light-emitting area of the light-emitting device blocked by the block retaining wall under the other smaller side viewing angle.

In this embodiment, the height of the black retaining wall is greater than the height of the light-emitting device in the direction perpendicular to the display module. Therefore, it is convenient for the black retaining wall to shield the light-emitting device, so as to adjust the transmittance of the anti-peep function layer in the side viewing angle range. Specifically, in any two different side viewing angles, the light-emitting area of the light-emitting device blocked by the black retaining wall under a larger side viewing angle is larger than the light-emitting area of the light-emitting device blocked by the block retaining wall under the other smaller side viewing angle. So that in any two different side viewing angles within the side viewing angle range of the display module, the transmittance of the anti-peep function layer under the larger side viewing angle is less than the transmittance of the anti-peep function layer under the smaller side viewing angle. So that the ratio of the viewing angle brightness of the compensation display assembly to the viewing angle brightness of the display panel at any one of the side viewing angles within the preset threshold range.

Optionally, in the display module provided by the present application, distances between any one of the light-emitting devices and the black retaining wall are equal.

In this embodiment, by making distances between any one of the light-emitting devices and the black retaining wall are equal, the light-emitting areas of the light-emitting devices that are blocked by the black barrier walls are equal in any one of the side viewing angles, so as to ensure a uniformity of the light-emitting brightness of the light-emitting devices under a same side viewing angle.

Optionally, in the display module provided in the present application, the anti-peep function layer has a louver structure, and the anti-peep function layer includes a plurality of louver films arranged at intervals, and wherein the anti-peep function layer is disposed on a side of the encapsulation layer away from the display function layer.

In this embodiment, the anti-peep function layer has a louver structure, and parameters such as distances between the louver films and directions of the louver films can be adjusted to achieve in any two different side viewing angles within the side viewing angle range of the display module, a transmittance of the anti-peep function layer under a larger side viewing angle is less than a transmittance of the anti-peep function layer under a smaller side viewing angle. So that a ratio of a viewing angle brightness of the compensation display assembly to a viewing angle brightness of the display panel at any one of the side viewing angles within a preset threshold range.

Optionally, in the display module provided by the present application, the light-transmitting functional layer further includes a first light-transmitting protective layer disposed on the anti-peep function layer close to the display function layer and a second light-transmitting protective layer disposed on the anti-peep function layer far away the display function layer.

In this embodiment, the anti-peep function layer is encapsulated by the first light-transmitting protective layer and the second light-transmitting protective layer, and at the same time, the first light-transmitting protective layer and the second light-transmitting protective layer can also combine the encapsulation layer to adjust a brightness of the light emitted from the display function layer within the front viewing angle range of the display module after exiting from the side of the viewing angle brightness adjustment layer away from the display function layer, to make the ratio of the viewing angle brightness of the compensation display assembly to the viewing angle brightness of the display panel in the front viewing angle range within the preset threshold range.

Optionally, in the display module provided in this application, the preset threshold range is greater than or equal to 0.95 and less than or equal to 1.05.

In this embodiment, by setting the preset threshold range to be greater than or equal to 0.95 and less than or equal to 1.05, it is possible to avoid too large difference between the viewing angle brightness of the compensation display assembly and the viewing angle brightness of the display panel under any one of the side viewing angles or any one of the front viewing angles. Thereby ensuring that the viewing angle brightness difference of the compensation display assembly and the viewing angle brightness of the display panel is within the sensitivity that can be distinguished by human eyes.

Optionally, in the display module provided in the present application, transmittances of the anti-peep function layer at different front viewing angles within the front viewing angle range of the display module are 100%.

In this embodiment, transmittances of the anti-peep function layer at different front viewing angles within the front viewing angle range of the display module are 100%. That is, within the front viewing angle range, the brightness of the light emitted by the display function layer after being emitted from the side of the viewing angle brightness adjustment layer away from the display function layer can be adjusted only by the light-transmitting functional layer, thereby achieving that the ratio of the viewing angle brightness of the compensation display assembly to the viewing angle brightness of the display panel within the range of the front viewing angle is within the preset threshold range.

Correspondingly, embodiments of the present application further provide a display device, including at least two display modules as described above, wherein two adjacent display modules are spliced along a first direction or a second direction, and wherein the first direction and the second direction are at a predetermined angle;

the display module includes a display panel and a compensation display assembly, wherein the display panel includes a display region and a frame region adjacent to the display region, and wherein the compensation display assembly is disposed on the display panel and is positioned in the frame region, and wherein the compensation display assembly includes:

a display function layer disposed on the display panel and positioned in the frame region; and a viewing angle brightness adjustment layer including an anti-peep function layer disposed on the display function layer, wherein the anti-peep function layer is configured to adjust a brightness of the light emitted from the display function layer within a side viewing angle range of the display module after exiting from a side of the viewing angle brightness adjustment layer away from the display function layer, to make a ratio of a viewing angle brightness of the compensation display assembly to a viewing angle brightness of the display panel at any one of the side viewing angles within a preset threshold range;

wherein an angle value of the any one of the side viewing angles within the side viewing angle range is greater than a preset angle value.

Optionally, in the display device provided by the present application, the viewing angle brightness adjustment layer further includes a light-transmitting functional layer laminated with the anti-peep function layer, and wherein the anti-peep function layer has same transmittance at different front viewing angles within a front viewing angle range of the display module, and wherein the light-transmitting functional layer is configured to adjust a brightness of the light emitted from the display function layer within the front viewing angle range of the display module after exiting from a side of the viewing angle brightness adjustment layer away from the display function layer, to make a ratio of a viewing angle brightness of the compensation display assembly to a viewing angle brightness of the display panel in the front viewing angle range within the preset threshold range;

wherein an angle value of the any one of the front viewing angles is less than or equal to the preset angle value.

Optionally, in the display device provided by the present application, the light-transmitting functional layer includes an encapsulation layer laminated with the anti-peep function layer, and wherein the display functional layer includes a plurality of light-emitting devices arranged at intervals, and wherein the encapsulation layer is disposed on each of the light-emitting devices.

Optionally, in the display device provided by the present application, in any two different side viewing angles within the side viewing angle range of the display module, a transmittance of the anti-peep function layer under a larger side viewing angle is less than a transmittance of the anti-peep function layer under a smaller side viewing angle.

Optionally, in the display device provided by the present application, the anti-peep function layer includes black retaining walls disposed between each of the light-emitting devices, and a height of the black retaining wall is greater than a height of the light-emitting device in a direction perpendicular to the display module, and wherein the encapsulation layer is disposed on the black retaining wall and each of the light-emitting devices;

in any two different side viewing angles, a light-emitting area of the light-emitting device blocked by the black retaining wall under a larger side viewing angle is larger than a light-emitting area of the light-emitting device blocked by the block retaining wall under the other smaller side viewing angle.

Optionally, in the display device provided by the present application, distances between any one of the light-emitting devices and the black retaining wall are equal.

Optionally, in the display device provided by the present application, the anti-peep function layer has a louver structure, and the anti-peep function layer includes a plurality of louver films arranged at intervals, and wherein the anti-peep function layer is disposed on a side of the encapsulation layer away from the display function layer.

Optionally, in the display device provided by the present application, the light-transmitting functional layer further includes a first light-transmitting protective layer disposed on the anti-peep function layer close to the display function layer and a second light-transmitting protective layer disposed on the anti-peep function layer far away the display function layer.

Optionally, in the display device provided by the present application, the preset threshold range is greater than or equal to 0.95 and less than or equal to 1.05.

Optionally, in the display device provided by the present application, transmittances of the anti-peep function layer at different front viewing angles within the front viewing angle range of the display module are 100%.

The beneficial effect of the present application: The compensating display assembly is disposed in the frame region of the display panel, wherein the compensating display assembly includes the display function layer and the viewing angle brightness adjustment layer provided on the display function layer. Therefore, it is convenient to adjust the brightness of the light emitted by the display function layer under different side viewing angles after exiting from the side of the viewing angle brightness adjustment layer away from the display function layer. Thereby achieving the ratio of the viewing angle brightness of the compensation display assembly to the viewing angle brightness of the display panel under any one of the side viewing angles is within the preset threshold range, to avoid a problem of inconsistent brightness and viewing angle at the splicing position after the display modules are spliced.

DESCRIPTION OF FIGURES

In order to explain the embodiments or the technical solutions in the prior art more clearly, the following will briefly introduce the figures that need to be used in the description of the embodiments or the prior art. Obviously, the figures in the following description are merely some embodiments of the present application. For those of ordinary skill in the art, other figures can be obtained based on these figures without inventive steps.

DETAILED DESCRIPTION OF EMBODIMENTS

The description of the following embodiments refers to the attached figures to illustrate specific embodiments in which the present application can be implemented. The directional terms mentioned in the present application, such as "up", "down", "front", "back", "left", "right", "inner", "outer", "side", etc., are for reference only a direction of the additional schema. Therefore, the directional terms are used to describe and understand the present application, rather than to limit the present application. In the figure, the units with similar structures are indicated by the same reference numerals.

In the description of the present application, it should be understood that the terms "first" and "second" are only used for description purposes, and cannot be understood as indicating or implying relative importance or implicitly indicating the number of indicated technical features. Therefore, the features defined with "first" and "second" may explicitly or implicitly include one or more of the features. In the description of the present application, "a plurality of" means two or more than two, unless otherwise specifically defined.

In the description of the present application, it should be noted that, unless otherwise clearly specified and limited, the terms "installation", "connection" and "connected" should be understood in a broad sense. For example, it can be a fixed connection, a detachable connection, or an integral connection. It can be mechanically connection, electrical connection, or communicate with each other. It can be directly connected or indirectly connected through an intermediate medium. It can be an internal communication of two components or the interaction of two components relation. For those of ordinary skill in the art, the specific meanings of the above terms in the present application can be understood according to specific circumstances.

The technical solution of the present application will now be described in conjunction with specific embodiments.

Figure 1:
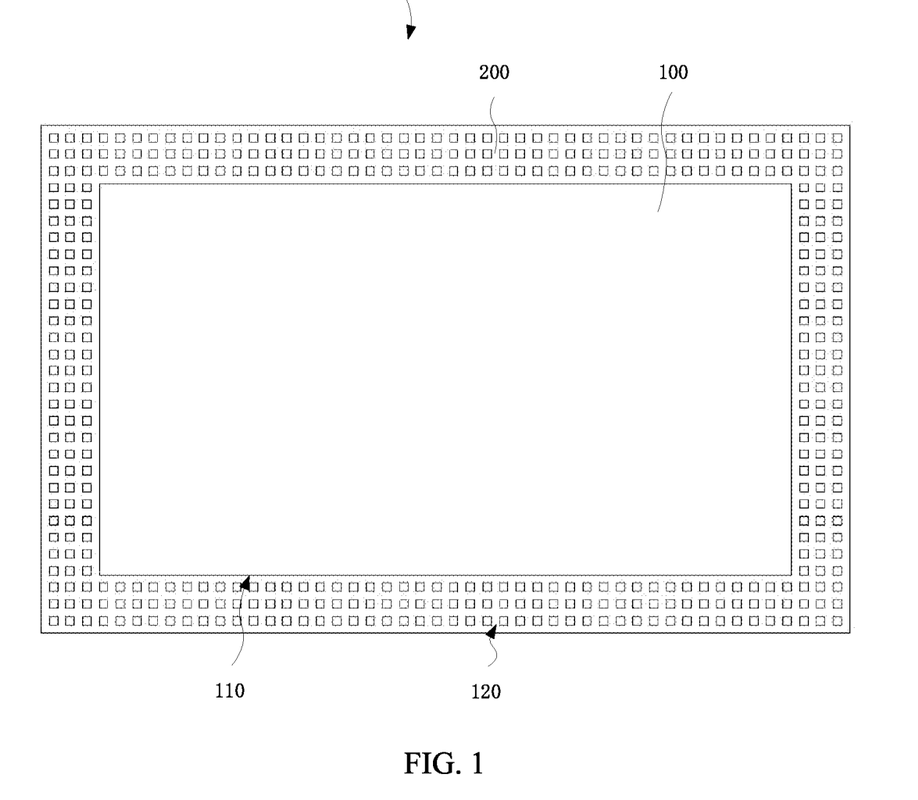
FIG. 1 is a schematic structural diagram of a display module provided by one embodiment of the present application.
Figure 2:
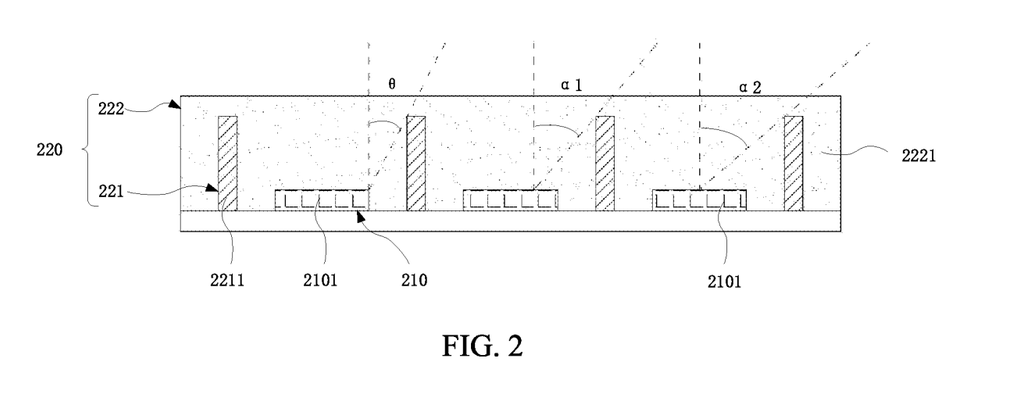
FIG. 2 is a schematic diagram of a first film structure of a compensation display assembly in the display module provided by one embodiment of the present application.
Figure 3:
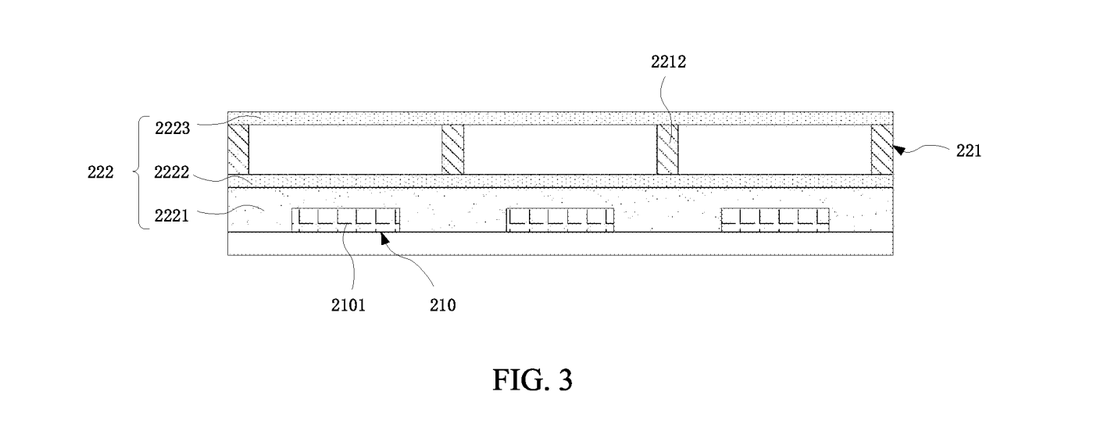
FIG. 3 is a schematic diagram of a second film structure of the compensation display assembly in the display module provided by one embodiment of the present application.

Please refer to FIGS. 1 to 3, one embodiment of the present application provides a display module 1, including a display panel 100 and a compensation display assembly 200. The display panel 100 includes a display region 110 and a frame region 120 adjacent to the display region 110. The compensation display assembly 200 is disposed on the display panel 100 and is positioned in the frame region 120. The compensation display assembly 200 includes:

a display function layer 210 disposed on the display panel 100 and positioned in the frame region 120;

a viewing angle brightness adjustment layer 220 including an anti-peep function layer 221 disposed on the display function layer 210, wherein the anti-peep function layer 221 is configured to adjust a brightness of the light emitted from the display function layer 221 within a side viewing angle range of the display module 1 after exiting from a side of the viewing angle brightness adjustment layer 220 away from the display function layer 210, to make a ratio of a viewing angle brightness of the compensation display assembly 200 to a viewing angle brightness of the display panel 100 at any one of the side viewing angles within a preset threshold range;

wherein an angle value of the any one of the side viewing angles within the side viewing angle range is greater than a preset angle value.

It is understandable that for the seamless splicing structure that adopts the compensation display assembly in the splicing region (non-display region) of the splicing screen, and the joint display of the splicing screen body and the compensation display assembly is realized. Because the splicing screen body and the compensation display assembly have different brightness and viewing angle brightness attenuation degrees, in the side viewing angle, it is easy to cause the splicing screen to have a problem of inconsistent brightness and viewing angle at the splicing region. For example, using mini light-emitting diode (Mini-LED) strips to set the splicing position between a plurality of liquid crystal displays. A brightness of the Mini-LED in the side view angle is brighter than a brightness of the LCD, so a problem of inconsistency in the brightness and viewing angle occurs in the side viewing angle. In the embodiments of the present application, the compensating display assembly 200 is disposed in the frame region 120 of the display panel 100, the compensating display assembly 200 includes the display function layer 210 and the viewing angle brightness adjustment layer 220 provided on the display function layer 210. Therefore, it is convenient to adjust the brightness of the light emitted by the display function layer 210 under different side viewing angles after exiting from the side of the viewing angle brightness adjustment layer 220 away from the display function layer 210. Thereby achieving the ratio of the viewing angle brightness of the compensation display assembly 200 to the viewing angle brightness of the display panel 100 under any one of the side viewing angles is within the preset threshold range, to avoid a problem of inconsistent brightness and viewing angle at the splicing position after the display modules 1 are spliced.

It should be noted that within the side viewing angle range of the display module 1, the display brightness of each display module 1 under different side viewing angles is different, and the viewing angle brightness of the display module 1 is a specific display brightness of the display module 1 under a side viewing angle or a front viewing angle. Similarly, the viewing angle brightness of the compensation display assembly 200 is the display brightness of the compensation display assembly 200 under a specific side viewing angle or a front viewing angle. The viewing angle brightness of the display panel 100 is the display brightness of the display panel 100 at a specific side viewing angle or a front viewing angle. In the embodiments of the present application, unless otherwise specified below, the display panel 100 is a liquid crystal display, and the display function layer 210 is a mini light-emitting diode light panel as an example for description.

It is worth noting that, in the embodiment of the present application, an angle value of the side viewing angle of the display module 1 is an angle value of an angle between a line of sight and a vertical line of the display module 1. At the same time, an angle value of the front viewing angle of the display module 1 is an angle value of the angle formed by the line of sight and the vertical line of the display module 1 under the front viewing angle. The ratio of the viewing angle brightness of the compensation display assembly 200 to the viewing angle brightness of the display panel 100 under any one of side viewing angles is within the preset threshold range. That is, a difference between the viewing angle brightness of the compensation display assembly 200 and the viewing angle brightness of the display panel 100 in any one of the side viewing angles can be reduced. Specifically, the preset threshold range is greater than or equal to 0.95 and less than or equal to 1.05, that is:

$$0.95 \leq M_\alpha/N_\alpha \leq 1.05.$$

$M_\alpha$ is a viewing angle brightness of the compensation display assembly 200 under the side viewing angle $\alpha$, and $N_\alpha$ is a viewing angle brightness of the display panel 100 under the side viewing angle $\alpha$.

In one embodiment, referring to FIGS. 1 to 3, the viewing angle brightness adjustment layer 220 further includes a light-transmitting functional layer 222 laminated with the anti-peeping function layer 221. The anti-peep function layer 221 has same transmittance at different front viewing angles within a front viewing angle range of the display module 210. The light-transmitting functional layer 222 is configured to adjust a brightness of the light emitted from the display function layer 210 within the front viewing angle range after exiting from a side of the viewing angle brightness adjustment layer 220 away from the display function layer 210, to make a ratio of a viewing angle brightness of the compensation display assembly 200 to a viewing angle brightness of the display panel 100 in the front viewing angle range within the preset threshold range;

wherein an angle value of the any one of the front viewing angles is less than or equal to the preset angle value.

It is understandable that the brightness of the liquid crystal display is lower than the brightness of the mini light-emitting diode. That is, there may be a large difference between the viewing angle brightness of the compensation display assembly 200 and the viewing angle brightness of the display panel 100 within the front viewing angle range. In this embodiment, the viewing angle brightness adjustment layer 220 further includes a light-transmitting functional layer 222 laminated with the anti-private functional layer 221, and the light-transmitting functional layer 222 can further reduce the viewing angle brightness of the compensation display assembly 200 within the front viewing angle range. So that the ratio of the viewing angle brightness of the compensation display assembly 200 to the viewing angle brightness of the display panel 100 within the front viewing angle range is within the preset threshold range. Specifically, the preset threshold range is greater than or equal to 0.95 and less than or equal to 1.05, that is:

$$0.95 \leq M\beta/N\beta \leq 1.05$$

$M_\beta$ is the viewing angle brightness of the compensation display assembly 200 at a front viewing angle β, and $N_\beta$ is the viewing angle brightness of the display panel 100 at the front viewing angle β.

It is worth noting that when the viewing angle brightness adjustment layer 220 further includes the light-transmitting functional layer 222 laminated with the anti-peep function layer 221, due to affect by the transmittance of the light-transmitting functional layer 222, the viewing angle brightness of the compensating display assembly 200 in the side viewing angle range will be correspondingly reduced. However, as the angle value of the side viewing angle increases within the side viewing angle range of the display module 1, a viewing angle brightness attenuation rate of the liquid crystal display is greater than a viewing angle brightness attenuation rate of the mini-LED. That is, the viewing angle brightness attenuation rate of the display panel 100 is greater than the viewing angle brightness attenuation rate of the compensation display assembly 200. At this time, it is still necessary to adjust the brightness of the light emitted by the display function layer 210 from the viewing angle brightness adjustment layer 220 away from the display function layer 210 within the side viewing angle range through the anti-peep function layer 221, to make the ratio of the viewing angle brightness of the compensation display assembly 200 to the viewing angle brightness of the display panel 100 under any one of the side viewing angles within the preset threshold range. At this time, the viewing angle brightness $M_\alpha$ of the compensated display assembly 200 under the side viewing angle α is:

$$M_\alpha = L1_\alpha \times Tr1_\alpha \times Tr2_\alpha$$

$L1_\alpha$ is a display brightness of the display function layer 210 at the side viewing angle α, $Tr1_\alpha$ is a transmittance of the anti-peep function layer 221 at the side viewing angle α, and $Tr2_\alpha$ is a transmittance of the light transmitting function layer 222 at the side viewing angle α.

Obviously, the light-transmitting functional layer 222 and the anti-peep function layer 221 are configured to adjust the attenuation rates of light output brightness and the viewing angle brightness of the compensation display assembly 200 within the side viewing angle range. In this way, the ratio of the viewing angle brightness of the compensation display assembly 200 to the viewing angle brightness of the display panel 100 at any viewing angle is within the preset threshold range.

It should be noted that the preset angle value is configured to divide the front viewing angle range and the side viewing angle range. Specifically, the preset angle value may be set according to the viewing angle brightness attenuation of the display panel 100. It can also be set according to a difference between the viewing angle brightness of the display panel 100 and the viewing angle brightness of the display function layer 210, which is not limited here.

In one embodiment, referring to FIGS. 2 to 3, the light-transmitting functional layer 222 includes an encapsulation layer 2221 laminated with the anti-peeping functional layer 221. The display functional layer 210 includes a plurality of light-emitting devices 2101 arranged at intervals. The encapsulation layer 2221 is disposed on each of the light-emitting devices 2101.

It is understandable that the light-emitting device 2101 is an LED, and the encapsulation layer 2221 is configured to encapsulate the light-emitting device 2101. The material or structure of the encapsulation layer 2221 can be adjusted to adjust the transmittance of encapsulation layer 2221. The ratio of the viewing angle brightness of the compensation display assembly 200 to the viewing angle brightness of the display panel 100 within the front viewing angle range is within the preset threshold range.

In one embodiment, referring to FIGS. 2 to 3, in any two different side viewing angles within the side viewing angle range of the display module 1, a transmittance of the anti-peep function layer 221 under a larger side viewing angle is less than a transmittance of the anti-peep function layer under a smaller side viewing angle. It is understandable that the brightness value of the liquid crystal display is less than the brightness value of the mini light-emitting diode, and, within the side viewing angle range of the display module 1, as the angle value of the side viewing angle increases, the viewing angle brightness attenuated rate of the liquid crystal display is greater than the viewing angle brightness attenuated rate of the mini light-emitting diode. Specifically, in two different side viewing angles within the side viewing angle range of the display module 1, a transmittance of the anti-peep function layer 221 under a larger side viewing angle is less than a transmittance of the anti-peep function layer under a smaller side viewing angle. That is, the transmittance of the anti-peep function layer 221 decreases as the angle value of the side viewing angle increases, thereby increasing the attenuation rate of the viewing angle brightness of the compensation display assembly 200 within the side viewing angle range, to make the ratio of the viewing angle brightness of the compensation display assembly 200 to the viewing angle brightness of the display panel 100 under any one of the side viewing angles is within the preset threshold range.

In one embodiment, referring to FIG. 2, the anti-peep function layer 221 includes black retaining walls 2211 disposed between each of the light-emitting devices 2101. In a direction perpendicular to the display module 1, a height of the black retaining wall 2211 is greater than a height of the light-emitting device 2101. The encapsulation layer 2221 is disposed on the black retaining wall 2211 and each of the light-emitting devices 2101;

in any two different side viewing angles, a light-emitting area of the light-emitting device 2101 blocked by the black retaining wall 2211 under a larger side viewing angle is larger than a light-emitting area of the light-emitting device 2101 blocked by the block retaining wall 2211 under the other smaller side viewing angle.

It is understandable that in the direction perpendicular to the display module 1, the height of the black retaining wall 2211 is greater than the height of the light-emitting device 2101, so that it is convenient for the black retaining wall 2211 to shield the light-emitting device 2101, so as to adjust the transmittance of the anti-peep function layer 221 in the side viewing angle range. In this embodiment, in any two different side viewing angles, a light-emitting area of the light-emitting device 2101 blocked by the black retaining wall 2211 under a larger side viewing angle is larger than a light-emitting area of the light-emitting device 2101 blocked by the block retaining wall 2211 under the other smaller side viewing angle. Therefore, in any two different side viewing angles within the side viewing angle range of the display module 1, the transmittance of the anti-peep function layer 221 under the larger side viewing angle is less than a transmittance of the anti-peep function layer 221 under the smaller side viewing angle, to make the ratio of the viewing angle brightness of the compensation display assembly 200 to the viewing angle brightness of the display panel 100 under any one of the side viewing angles is within the preset threshold range.

Specifically, an angle value of the side viewing angle of the display module 1 is an angle value of an angle between a line of sight and a vertical line of the display module 1. At the same time, an angle value of the front viewing angle of the display module 1 is an angle value of the angle formed by the line of sight and the vertical line of the display module 1 under the front viewing angle. Please refer to FIG. 2, the angle value of the preset angle may be θ, when an angle value of viewing angle is less than or equal to θ, the light-emitting device 2101 is not blocked by the black retaining wall 2211, when the angle value of viewing angle is greater than θ, the light-emitting device 2101 is blocked by the black retaining wall 2211. That is, the angle value of any one of the front viewing angles in the front viewing angle range is less than or equal to θ, and the angle value of any one of the side viewing angles in the side viewing angle range is greater than θ. The angle values of any two different side viewing angles are respectively α1 and α2. α2 is greater than α1. Obviously, a light-emitting area of the light-emitting device 2101 blocks by the black barrier wall 2211 when the angle value of the side viewing angle is α1 is larger than a light-emitting area of the light-emitting device 2101 blocks by the black barrier wall 2211 when the angle value of the side viewing angle is α2.

It should be noted that the black retaining walls 2211 are arranged between each of the light-emitting devices 2101, and the black retaining walls 2211 and the light-emitting devices 2101 are covered and encapsulated by the encapsulation layer 2221, so that a relative positional relationship between the black retaining walls 2211 and each of the light-emitting devices 2101 is relatively stable, which avoids a problem of misalignment caused by disposing the black retaining walls 2211 on the side of the encapsulation layer 2221 away from each of the light-emitting devices 2101.

In this embodiment, the distances between any one of light-emitting devices 2101 and the black retaining wall 2211 are equal. It can be understood that the distances between any one of light-emitting devices 2101 and the black retaining wall 2211 are equal. That is, it can be ensured that the light-emitting area of each of the light-emitting devices 2101 blocked by the black retaining wall 2211 are equal under any of the side viewing angles, and a uniformity of the light-emitting brightness of each light-emitting device 2101 under the same side viewing angle can be ensured In one embodiment, referring to FIG. 3, the anti-peep function layer 221 is a louver structure, the anti-peep function layer 221 includes a plurality of louver diaphragms 2212 arranged at intervals. The anti-peep function layer 221 is disposed on the side of the encapsulation layer 2221 away from the display function layer 210.

It is understandable that the anti-peep function layer 221 has a louver structure. The anti-peep function layer 221 includes a plurality of louver films 2212 arranged at intervals. Specifically, parameters such as the distance between the louver films 2212 and directions of the louver films 2212 can be adjusted to achieve in any two different side viewing angles within the side viewing angle range of the display module 1, a transmittance of the anti-peep function layer 221 under a larger side viewing angle is less than a transmittance of the anti-peep function layer 221 under a smaller side viewing angle, to make a ratio of a viewing angle brightness of the compensation display assembly 200 to a viewing angle brightness of the display panel 100 at any one of the side viewing angles within a preset threshold range.

In this embodiment, referring to FIG. 3, the light-transmitting functional layer 222 further includes a first light-transmitting protective layer 2222 disposed on the anti-peep function layer 221 close to the display function layer 210 and a second light-transmitting protective layer 2223 disposed on the anti-peep function layer 221 far away the display function layer 210.

It is understandable that the light-transmitting functional layer 222 further includes the first light-transmitting protective layer 2222 and the second light-transmitting protective layer 2223. The first light-transmitting protective layer 2222 and the second light-transmitting layer 2223 are configured to encapsulate the anti-peep function layer 221. At the same time, the first light-transmitting protective layer 2222 and the second light-transmitting protective layer 2223 can also be combined with the encapsulation layer 2221 to adjust a brightness of the light emitted from the display function layer 210 within the front viewing angle range after exiting from a side of the viewing angle brightness adjustment layer 220 away from the display function layer 210, to make a ratio of a viewing angle brightness of the compensation display assembly 200 to a viewing angle brightness of the display panel 100 in the front viewing angle range within the preset threshold range. Specifically, the transmittance $Tr2_\alpha$ of the light-transmitting functional layer 222 at the side viewing angle α is:

$$Tr2_\alpha = Tr21_\alpha \times Tr22_\alpha \times Tr23_\alpha$$

$Tr21_\alpha$ is a display brightness of the encapsulation layer 2221 at a side viewing angle α, $Tr22_\alpha$ is a transmittance of the first light-transmitting protective layer 2222 at a side viewing angle α, and $Tr23_\alpha$ is a transmittance of the second light-transmitting protective layer 2223 at a side viewing angle α. Obviously, the material or structure of the first light-transmitting protective layer 2222 and the second light-transmitting protective layer 2223 are adjusted to achieve an adjustment of the transmittance of the first light-transmitting protective layer 2222 and the second light-transmitting protective layer 2223. In this embodiment, the material of the first light-transmitting protective layer 2222 and the second light-transmitting protective layer 2223 may be polyethylene terephthalate.

In one embodiment, transmittances of the anti-peep function layer 221 at different front viewing angles within the front viewing angle range of the display module 1 are 100%.

It is understandable that, as in the foregoing embodiment, the anti-peep function layer 221 may include a plurality of louver films 2212 arranged at intervals. The anti-peep function layer 221 may also include a plurality of black retaining wall 2211 disposed between the light-emitting devices 2101. Obviously, within the front viewing angle range, the anti-peep function layer 221 does not shield the light-emitting device 2101, to make a transmittance of the anti-peep function layer 221 is 100% at different front viewing angles within the front viewing angle range of the display module 1. That is, within the front viewing angle range, the brightness of the light emitted by the display function layer 210 from the viewing angle brightness adjustment layer 220 away from the display function layer 210 can be adjusted only by the light-transmitting functional layer 222, to make a ratio of a viewing angle brightness of the compensation display assembly 200 to a viewing angle brightness of the display panel 100 at any one of the side viewing angles within the preset threshold range.

Figure 4:
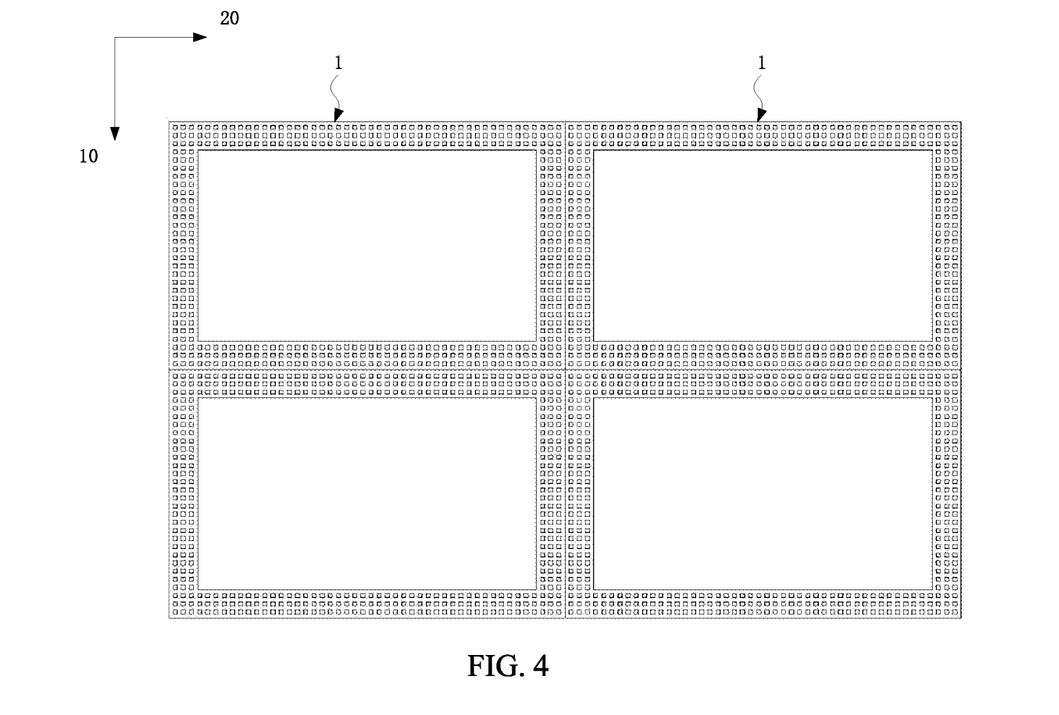
FIG. 4 is a schematic structural diagram of a display device provided by one embodiment of the present application.

One embodiment of the present application also provides a display device. Please refer to FIG. 4. The display device includes at least two display modules 1 as described in the previous embodiment. Two adjacent display modules 1 are spliced along a first direction 10 or a second direction 20. An angle between the first direction 10 and the second direction 20 are at a predetermined included angle. In this embodiment, the first direction 10 and the second direction 20 are perpendicular to each other.

In the present application, a compensation display assembly 200 is provided in the frame region 120 of the display panel 100. The compensation display assembly 200 includes a display function layer 210 and a viewing angle brightness adjustment layer 220 disposed on the display function layer 210. Therefore, it is convenient to adjust the brightness of the light emitted by the display function layer 210 from the side of the viewing angle brightness adjustment layer 220 away from the display function layer 210 under different side viewing angles, so as to a ratio of a viewing angle brightness of the compensation display assembly 200 to a viewing angle brightness of the display panel 100 at any one of the side viewing angles within a preset threshold range, to avoid a problem of inconsistent brightness and viewing angle at the splicing position after the display modules 1 are spliced In summary, although the present application has been disclosed in preferred embodiments as above, the above-mentioned preferred embodiments are not intended to limit the present application. Those of ordinary skill in the art can make various changes and modifications without departing from the spirit and scope of the present application. Therefore, a protection scope of the present application is subject to a scope defined by the claims.

What is claimed is:

1. A display module comprising a display panel and a compensation display assembly, wherein the display panel comprises a display region and a frame region adjacent to the display region, and wherein the compensation display assembly is disposed on the display panel and is positioned in the frame region, and wherein the compensation display assembly comprises:
a display function layer disposed on the display panel and positioned in the frame region; and
a viewing angle brightness adjustment layer comprising an anti-peep function layer disposed above the display function layer and a light-transmitting functional layer laminated with the anti-peep function layer,
wherein transmittances of the anti-peep function layer at different front viewing angles within a front viewing angle range of the display module are 100%,
the light-transmitting functional layer is configured to adjust a brightness of light emitted from the display function layer within the front viewing angle range of the display module after exiting from a side of the viewing angle brightness adjustment layer away from the display function layer, to make a ratio of a viewing angle brightness of the compensation display assembly to a viewing angle brightness of the display panel in the front viewing angle range within a preset threshold range,
the anti-peep function layer is configured to adjust a brightness of light emitted from the display function layer within a side viewing angle range of the display module after exiting from a side of the viewing angle brightness adjustment layer away from the display function layer, to make a ratio of a viewing angle brightness of the compensation display assembly to a viewing angle brightness of the display panel at any one of side viewing angles within the preset threshold range;
wherein an angle value of the any one of the front viewing angles within the front viewing angle range is less than or equal to the preset angle value, and an angle value of the any one of the side viewing angles within the side viewing angle range is greater than a preset angle value,
the light-transmitting functional layer further comprises a first light-transmitting protective layer disposed on the anti-peep function layer close to the display function layer,
the display function layer comprises a plurality of light-emitting devices arranged at intervals, and
the anti-peep function layer comprises black retaining walls each disposed between every adjacent two of the light-emitting devices, and a height of a black retaining wall is greater than a height of each of the light-emitting devices in a direction perpendicular to the display module.

2. The display module according to claim 1, wherein the light-transmitting functional layer comprises an encapsulation layer laminated with the anti-peep function layer, and the encapsulation layer is disposed on each of the light-emitting devices.

3. The display module according to claim 2, wherein in any two different side viewing angles within the side viewing angle range of the display module, a transmittance of the anti-peep function layer under a larger side viewing angle is less than a transmittance of the anti-peep function layer under a smaller side viewing angle.

4. The display module according to claim 3, wherein the encapsulation layer is disposed on the black retaining wall and each of the light-emitting devices;
in any two different side viewing angles, a light-emitting area of each of the light-emitting devices blocked by the black retaining wall under a larger side viewing angle is larger than a light-emitting area of each of the light-emitting devices blocked by the black retaining wall under the other smaller side viewing angle.

5. The display module according to claim 4, wherein a distance between any one of the light-emitting devices and an adjacent one of the black retaining walls is equal.

6. The display module according to claim 3, wherein the anti-peep function layer has a louver structure, and the anti-peep function layer comprises a plurality of louver films arranged at intervals, and wherein the anti-peep function layer is disposed on a side of the encapsulation layer away from the display function layer.

7. The display module according to claim 6, wherein the light-transmitting functional layer further comprises a second light-transmitting protective layer disposed on the anti-peep function layer far away from the display function layer.

8. The display module according to claim 1, wherein the preset threshold range is greater than or equal to 0.95 and less than or equal to 1.05.

9. A display device comprising at least two display modules, wherein two adjacent display modules are spliced along a first direction or a second direction, and wherein an angle between the first direction and the second direction are at a predetermined angle;
   each of the at least two display modules comprises a display panel and a compensation display assembly, wherein the display panel comprises a display region and a frame region adjacent to the display region, and wherein the compensation display assembly is disposed on the display panel and is positioned in the frame region, and wherein the compensation display assembly comprises:
   a display function layer disposed on the display panel and positioned in the frame region; and
   a viewing angle brightness adjustment layer comprising an anti-peep function layer disposed above the display function layer and a light-transmitting functional layer laminated with the anti-peep function layer,
   wherein transmittances of the anti-peep function layer at different front viewing angles within a front viewing angle range of the display module are 100%,
   the light-transmitting functional layer is configured to adjust a brightness of light emitted from the display function layer within the front viewing angle range of the display module after exiting from a side of the viewing angle brightness adjustment layer away from the display function layer, to make a ratio of a viewing angle brightness of the compensation display assembly to a viewing angle brightness of the display panel in the front viewing angle range within a preset threshold range,
   the anti-peep function layer is configured to adjust a brightness of light emitted from the display function layer within a side viewing angle range of the display module after exiting from a side of the viewing angle brightness adjustment layer away from the display function layer, to make a ratio of a viewing angle brightness of the compensation display assembly to a viewing angle brightness of the display panel at any one of side viewing angles within the preset threshold range;
   wherein an angle value of the any one of the front viewing angles within the front viewing angle range is less than or equal to the preset angle value, and an angle value of the any one of the side viewing angles within the side viewing angle range is greater than a preset angle value,
   the light-transmitting functional layer further comprises a first light-transmitting protective layer disposed on the anti-peep function layer close to the display function layer,
   the display function layer comprises a plurality of light-emitting devices arranged at intervals, and
   the anti-peep function layer comprises black retaining walls each disposed between every adjacent two of the light-emitting devices, and a height of a black retaining wall is greater than a height of each of the light-emitting devices in a direction perpendicular to the display module.

10. The display device according to claim 9, wherein the light-transmitting functional layer comprises an encapsulation layer laminated with the anti-peep function layer, and the encapsulation layer is disposed on each of the light-emitting devices.

11. The display device according to claim 10, wherein in any two different side viewing angles within the side viewing angle range of the display module, a transmittance of the anti-peep function layer under a larger side viewing angle is less than a transmittance of the anti-peep function layer under a smaller side viewing angle.

12. The display device according to claim 11, wherein the encapsulation layer is disposed on the black retaining wall and each of the light-emitting devices;
   in any two different side viewing angles, a light-emitting area of each of the light-emitting devices blocked by the black retaining wall under a larger side viewing angle is larger than a light-emitting area of each of the light-emitting devices blocked by the black retaining wall under the other smaller side viewing angle.

13. The display device according to claim 12, wherein a distance between any one of the light-emitting devices and an adjacent one of the black retaining walls is equal.

14. The display device according to claim 11, wherein the anti-peep function layer has a louver structure, and the anti-peep function layer comprises a plurality of louver films arranged at intervals, and wherein the anti-peep function layer is disposed on a side of the encapsulation layer away from the display function layer.

15. The display device according to claim 14, wherein the light-transmitting functional layer further comprises a second light-transmitting protective layer disposed on the anti-peep function layer far away from the display function layer.

16. The display device according to claim 9, wherein the preset threshold range is greater than or equal to 0.95 and less than or equal to 1.05.

* * * * *